United States Patent [19]
Sweatt et al.

[11] Patent Number: 6,060,224
[45] Date of Patent: May 9, 2000

[54] METHOD FOR MASKLESS LITHOGRAPHY

[76] Inventors: William C. Sweatt, 13027 Arrovo de Vista, Albuquerque, N. Mex. 87111; Richard H. Stulen, 5258 Roxanne Ct., Livermore, Alameda County, Calif. 94550

[21] Appl. No.: 09/231,909

[22] Filed: Jan. 14, 1999

Related U.S. Application Data

[62] Division of application No. 08/878,444, Jun. 18, 1997, Pat. No. 5,870,176.
[60] Provisional application No. 60/020,090, Jun. 19, 1996.

[51] Int. Cl.$^7$ ....................................... G03C 5/10
[52] U.S. Cl. ..................... 430/395; 430/311; 430/396; 359/223; 250/492.2
[58] Field of Search .................. 430/5, 322, 311, 430/395, 396; 355/53, 67; 359/223, 224, 254, 871, 872; 378/34, 35; 250/492.2

[56] References Cited

U.S. PATENT DOCUMENTS

| | | | |
|---|---|---|---|
| 4,793,699 | 12/1988 | Tokuhara | 350/487 |
| 5,539,567 | 7/1996 | Lin et al. | 359/281 |
| 5,539,568 | 7/1996 | Lin et al. | 359/285 |
| 5,631,782 | 5/1997 | Smith et al. | 359/871 |
| 5,691,541 | 11/1997 | Ceglio et al. | 250/492.1 |
| 5,796,508 | 8/1998 | Suzuki | 359/224 |
| 5,877,844 | 3/1999 | Matsumoto | 355/35 |

FOREIGN PATENT DOCUMENTS

| | | |
|---|---|---|
| 10112579 | 4/1998 | Japan . |
| 9804950 | 2/1998 | WIPO . |

*Primary Examiner*—Sharon Gibson
*Assistant Examiner*—Jill N. Holloman
*Attorney, Agent, or Firm*—Timothy Evans

[57] ABSTRACT

The present invention provides a method for maskless lithography. A plurality of individually addressable and rotatable micromirrors together comprise a two-dimensional array of micromirrors. Each micromirror in the two-dimensional array can be envisioned as an individually addressable element in the picture that comprises the circuit pattern desired. As each micromirror is addressed it rotates so as to reflect light from a light source onto a portion of the photoresist coated wafer thereby forming a pixel within the circuit pattern. By electronically addressing a two-dimensional array of these micromirrors in the proper sequence a circuit pattern that is comprised of these individual pixels can be constructed on a microchip. The reflecting surface of the micromirror is configured in such a way as to overcome coherence and diffraction effects in order to produce circuit elements having straight sides.

13 Claims, 8 Drawing Sheets

METHOD FOR MASKLESS LITHOGRAPHY

CROSS REFERENCE TO RELATED APPLICATIONS

The following application for U.S. Patent is a division of U.S. patent application Ser. No. 08/878,444, now U.S. Pat. No. 5,870,176, filed Jun. 18, 1997, entitled MASKLESS LITHOGRAPHY, from which priority is hereby claimed.

The present application is related to co-pending provisional application Ser. No. 60/020,090, Filed Jun. 19, 1996, Entitled PROGRAMMABLE MASK FOR SCANNING PROJECTION LITHOGRAPHY. from which benefit is claimed under 35 U.S.C. §119(e).

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND OF THE INVENTION

This invention pertains generally to a method for forming patterns on a semiconductor wafer and to an apparatus to practice the method and, more particularly, to maskless projection lithography.

At the present time, the patterns on semiconductor wafers, which represent electronic components and their interconnections, are produced by "writing" the pattern from a mask onto a photoresist covered wafer by a process such as projection lithography. The conventional projection lithographic process employed for producing electronic circuits on semiconductor wafers is similar to exposing a film negative onto photographic paper except that the transferred image is reduced (typically by from 4× to 10×) by a camera rather than enlarged, thereby making the circuit elements smaller. This process is illustrated in FIG. 1. Light from a light source 110 shines onto a mask 120 containing a circuit pattern. During the process, mask 120 is caused to move in one direction. The light that penetrates the mask pattern, representing the circuit pattern desired to be reproduced, is focused onto a photoresist coated wafer 130 by camera 140 which forms a focused image of the mask demagnified (reduced) by a factor of typically between 4× and 10×. The wafer 130 is moving in a direction opposite to that of mask 120 such that the image of the mask features are stationary on the wafer.

While effective, this process has numerous drawbacks associated principally with the masks such as the cost of fabricating masks, the time required to produce the sets of masks needed to fabricate microchips, diffraction effects resulting from light from light source 110 being diffracted from opaque portions of the mask, registration errors during mask alignment for multilevel patterns, color centers formed in the mask substrate, defects in the mask or the presence of dust particles on the mask that are rendered as imperfections in the circuit pattern, the necessity for periodic mask cleaning and the deterioration of the mask that follows therefrom. These drawbacks are particularly pronounced during the process of producing prototype microchips. Any minor error or flaw in the circuit design layout or any change in the circuit design can require the fabrication of a full set of masks; an expensive and time consuming process. The aforementioned drawbacks are particularly noticeable when producing small lots of microchips or specialty microchips. What is needed is a method for eliminating the use of a mask in fabricating circuit patterns on semiconductor wafers.

Responsive to these needs the present invention provides a method for producing circuit patterns on semiconductor wafers without the need for a mask.

SUMMARY OF THE INVENTION

The present invention overcomes deficiencies associated with conventional methods of fabricating microchips by replacing the mask used in a conventional scanning projection lithography system with a two-dimensional array of micromirrors that are used to produce a circuit pattern on a semiconductor wafer. The present invention further eliminates problems of mask alignment during the intricate adjustments of the wafer stage and multi-level microcircuitry, the effect of defects in the mask and provides for the use of extreme ultraviolet light sources.

BRIEF DESCRIPTION OF THE DRAWINGS

The accompanying drawings, which are incorporated in and form part of the specification, illustrate the present invention and, together with the description, explain the invention. In the drawings like elements are referred to by like numbers.

DESCRIPTION OF THE INVENTION

Figure 1:
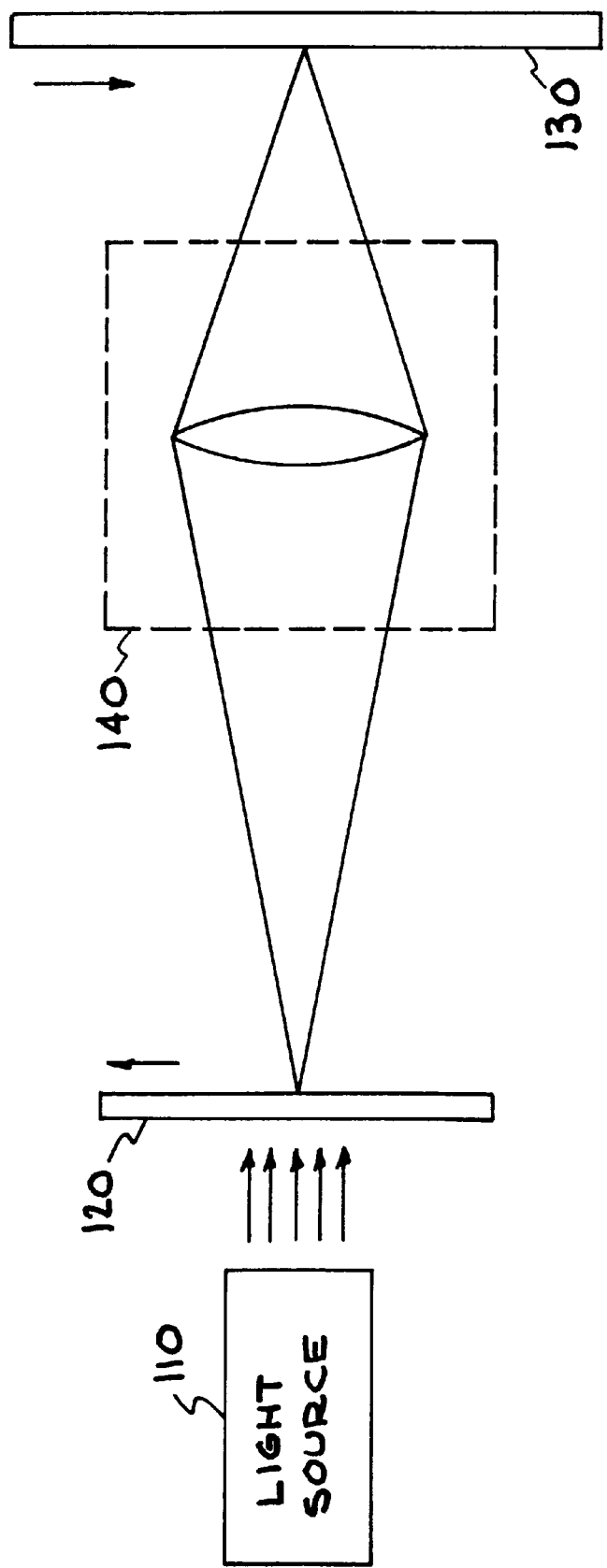
FIG. 1 illustrates prior art scanning lithography system.
Figure 2A:
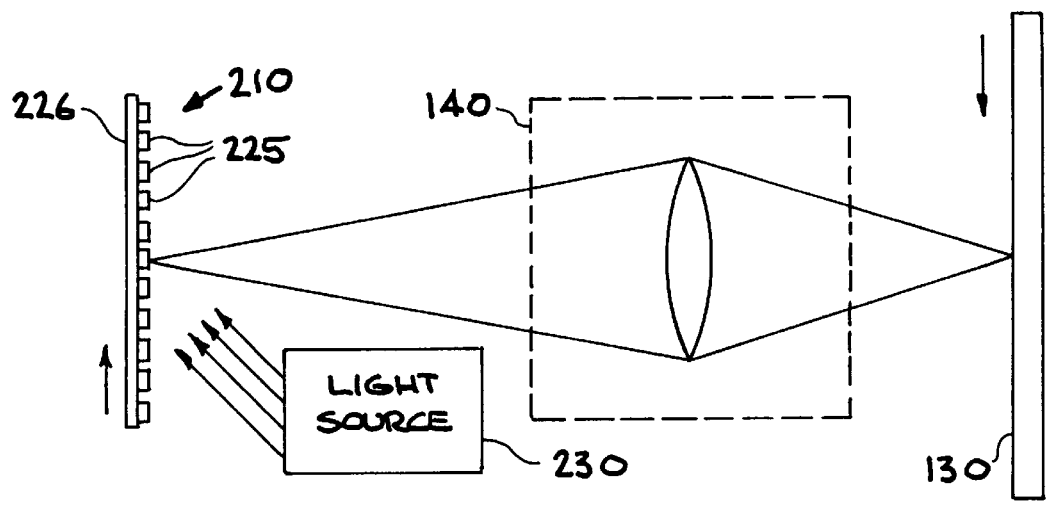
FIG. 2 illustrates an embodiment of the present invention.
Figure 2B:
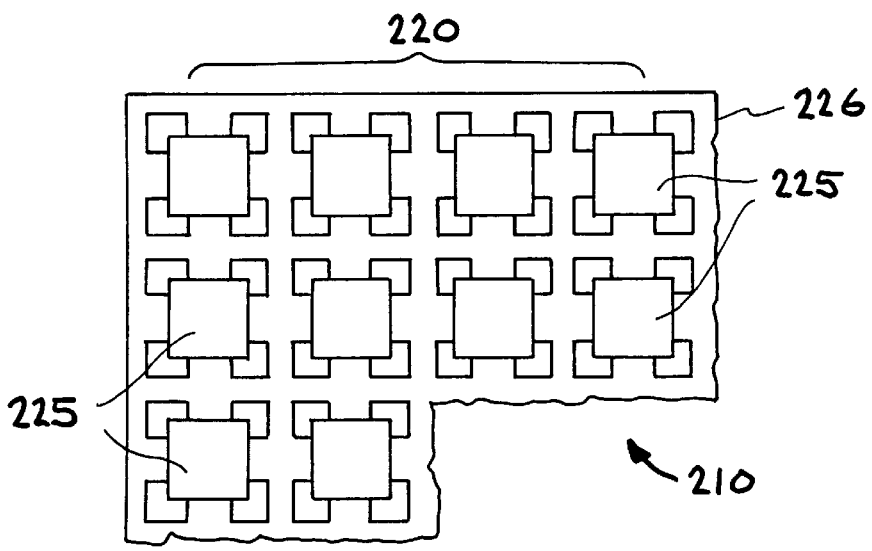

The present invention overcomes the drawbacks associated with conventional methods of fabricating microchips by replacing the mask 120 used in a projection lithography system with a plurality of rotatable micromirrors that can be arranged in a two-dimensional array, such as illustrated in FIG. 2. As used hereinafter, the term micromirror refers to a reflecting surface 225, disposed on a substrate 226, whose principal dimension is $\approx \mu m$, typically $\approx 20$ $\mu m$ or less. By replacing the mask used in conventional projection lithography, the invention described herein greatly reduces the cost of fabricating small lots of microchips and further, speeds up the process of prototyping new microchip designs. Here a plurality of individually addressable and rotatable micromirrors 220, that together comprise a two-dimensional array 210, reflect light from a light source 230 through camera 140 that forms a focused but demagnified (reduced) image of the micromirror, onto photoresist coated wafer 130.

Each micromirror 220 in array 210 can be envisioned as an individually addressable element in the picture that comprises the circuit pattern desired. As each micromirror is addressed it rotates so as to reflect light from light source 230 onto a portion of the photoresist coated wafer thereby forming a pixel within the circuit pattern. By electronically addressing a two-dimensional array of these micromirrors in the proper sequence a circuit pattern that is comprised of these individual pixel elements can be constructed on a microchip.

The present invention also provides significant advantage in the production of binary optical elements (BOE). High efficiency BOEs are made by contact printing and typically require four masks to create 16 phase levels. Thus, a complete set of fabrication steps must be carried out for each level, i.e., spin on the resist, expose the resist and process, while maintaining the mask aligned to the substrate throughout the processing sequence. However, by using the method of maskless lithography disclosed herein, it is possible to create the different phase levels by means of variable level exposure, i.e., the step height is now a function of the exposure level.

Figure 3A:
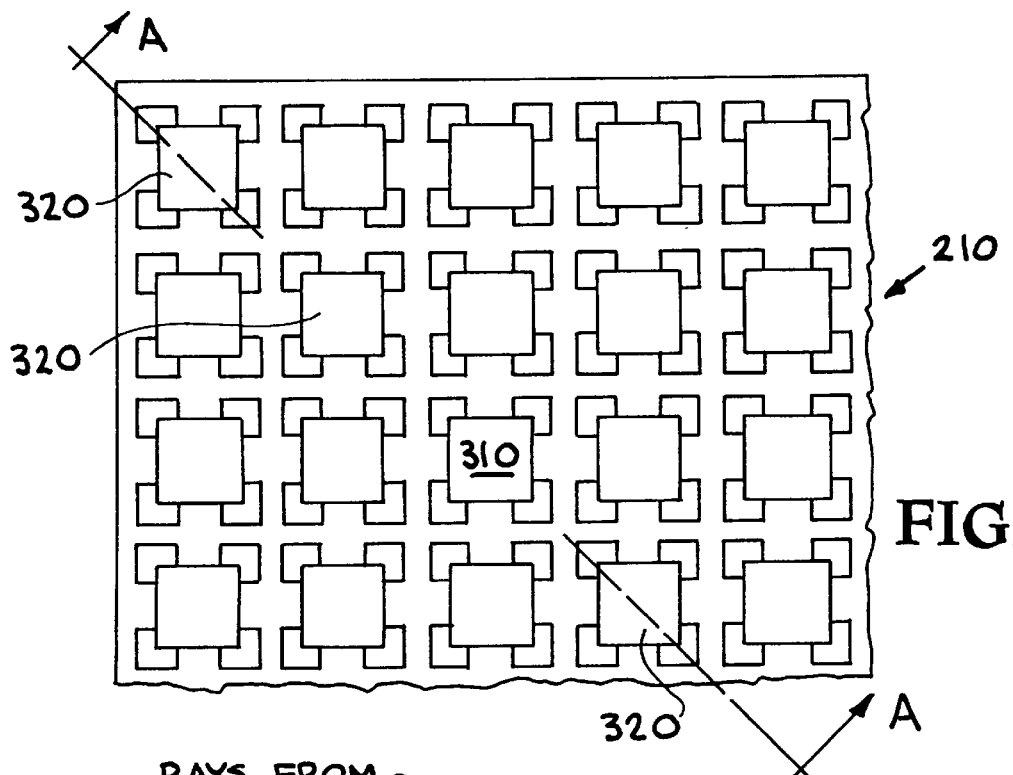
FIG. 3 shows the principle of operation of the invention.
Figure 3B:
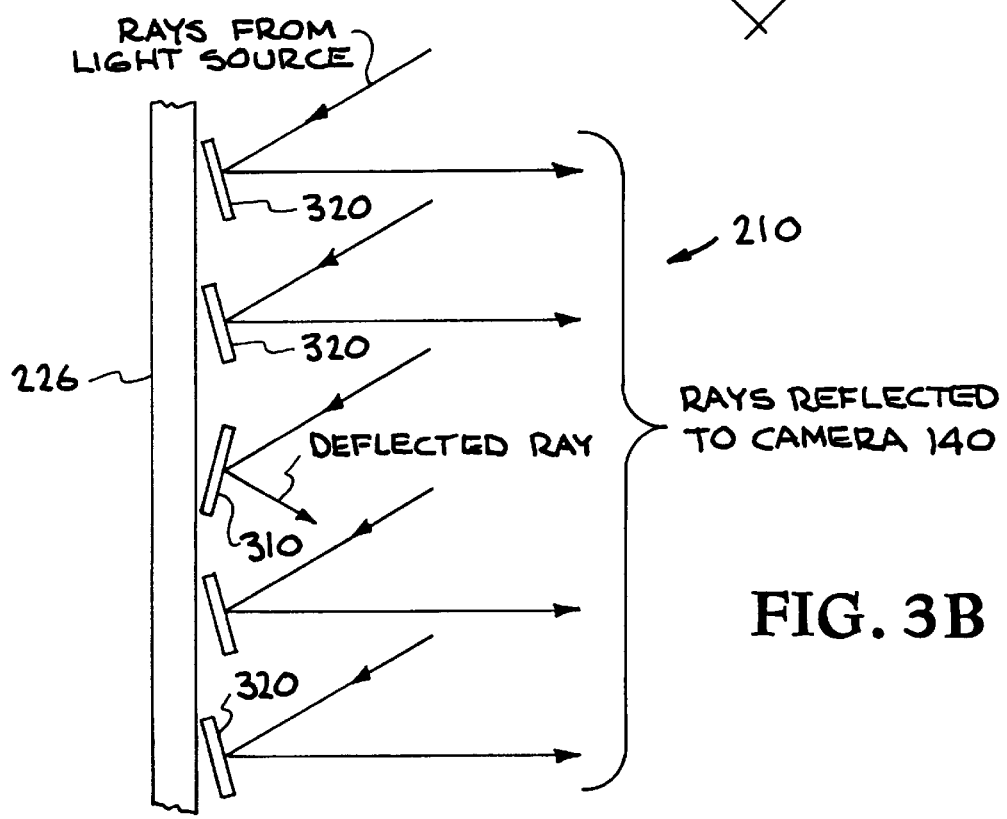

FIG. 3 generally sets forth the method of operation of a two-dimensional array of micromirrors such as 210. An electronically generated mask pattern is caused to move across the face of array 210, in much the same way words scroll across an electronic signboard, by causing those micromirrors which are supposed to be dark, such as illustrated by micromirror 310, to be rotated slightly such that light from a light source reflected from micromirror 310 is not intercepted by camera 140 (i.e., micromirror 310 is in the "off" position). On the other hand, those micromirrors, such as 320, that are intended to reflect light from a light source onto photoresist coated wafer 130, thereby forming a pixel, are rotated such that the light reflected from micromirror 320 is intercepted by camera 140 and projected onto photoresist coated wafer 130 (i.e., micromirror 320 is in the "on" position). As is the case in conventional scanning lithography,. the image moving across array 210 projected by camera 140 will move in synchrony with wafer 130.

Figure 4:
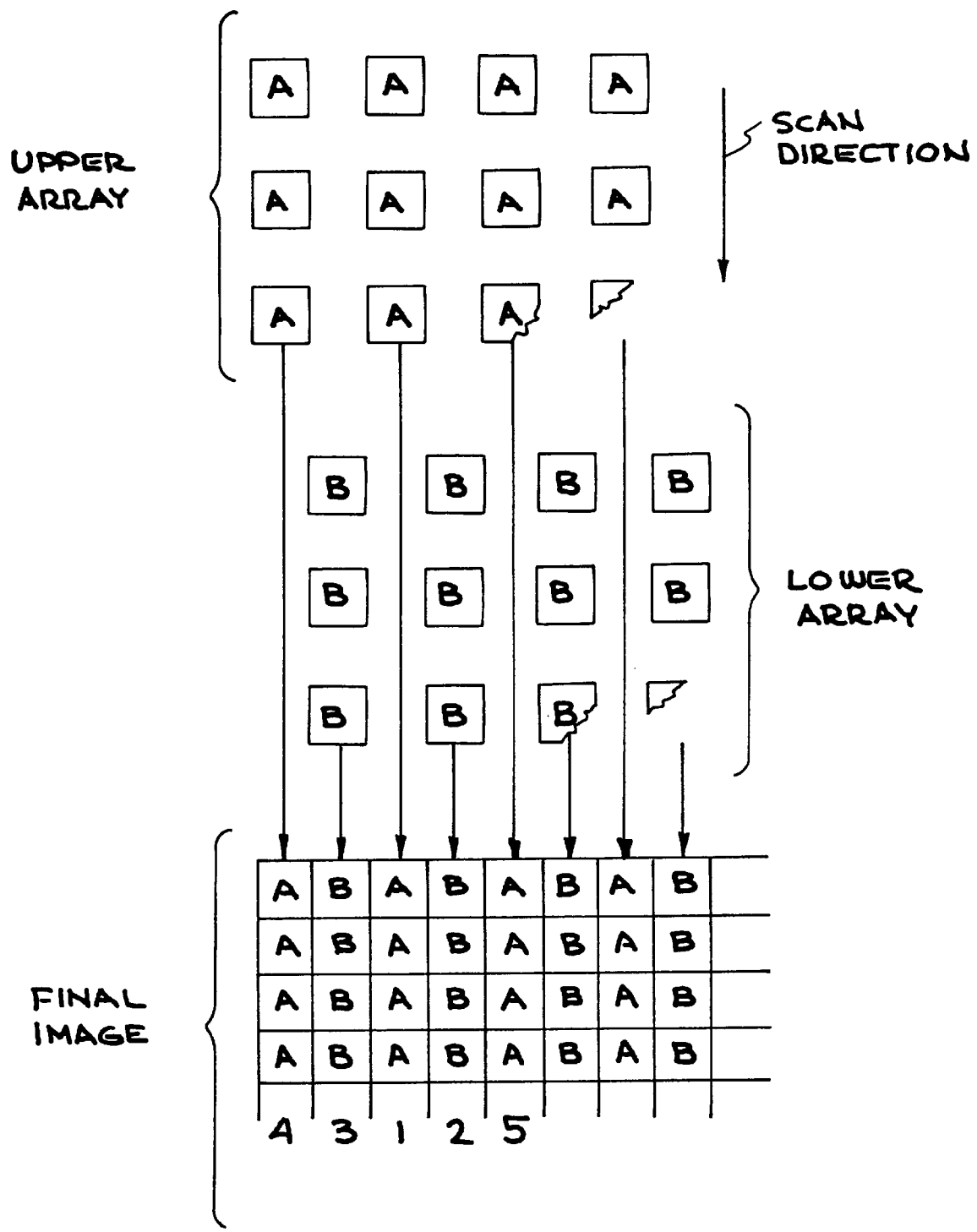
FIG. 4 shows an interleaved micromirror array.

In one embodiment of the present invention, the array of micromirrors is illuminated with a light source comprising a pulsed laser, particularly an excimer laser and preferably a KrF, F or ArF excimer laser. A high repetition rate light source is preferred in order to give a writing speed of about 5 mm/s (i.e., 20 kHz). In a second embodiment, the array of micromirrors is illuminated with a pulsed or mechanically chopped source having a wide wavelength spectrum, particularly a discharge lamp and preferably a high pressure arc lamp. In a third embodiment, at least two arrays of micromirrors can be interleaved, as illustrated in FIG. 4, in order to produce a greater number of pixels on the photoresist coated wafer with the same reticle dimension, thereby eliminating the need for step and repeat processing. Interleaved arrays also provide for minimizing boundary errors. Further, increasing the array size by interleaving micromirror arrays, as described herein, also provides for increasing resolution, thereby improving the quality of the image projected onto the photoresist coated wafer. As shown in FIG. 4, a two-dimensional array of pixels can be produced by interleaving two separate arrays of micromirrors A and B horizontally such that columns of A micromirrors alternate with columns of B micromirrors. By way of example, columns marked A can be written by the upper array of micromirrors U and columns marked B can be written by lower array of micromirrors L.

Figure 5:
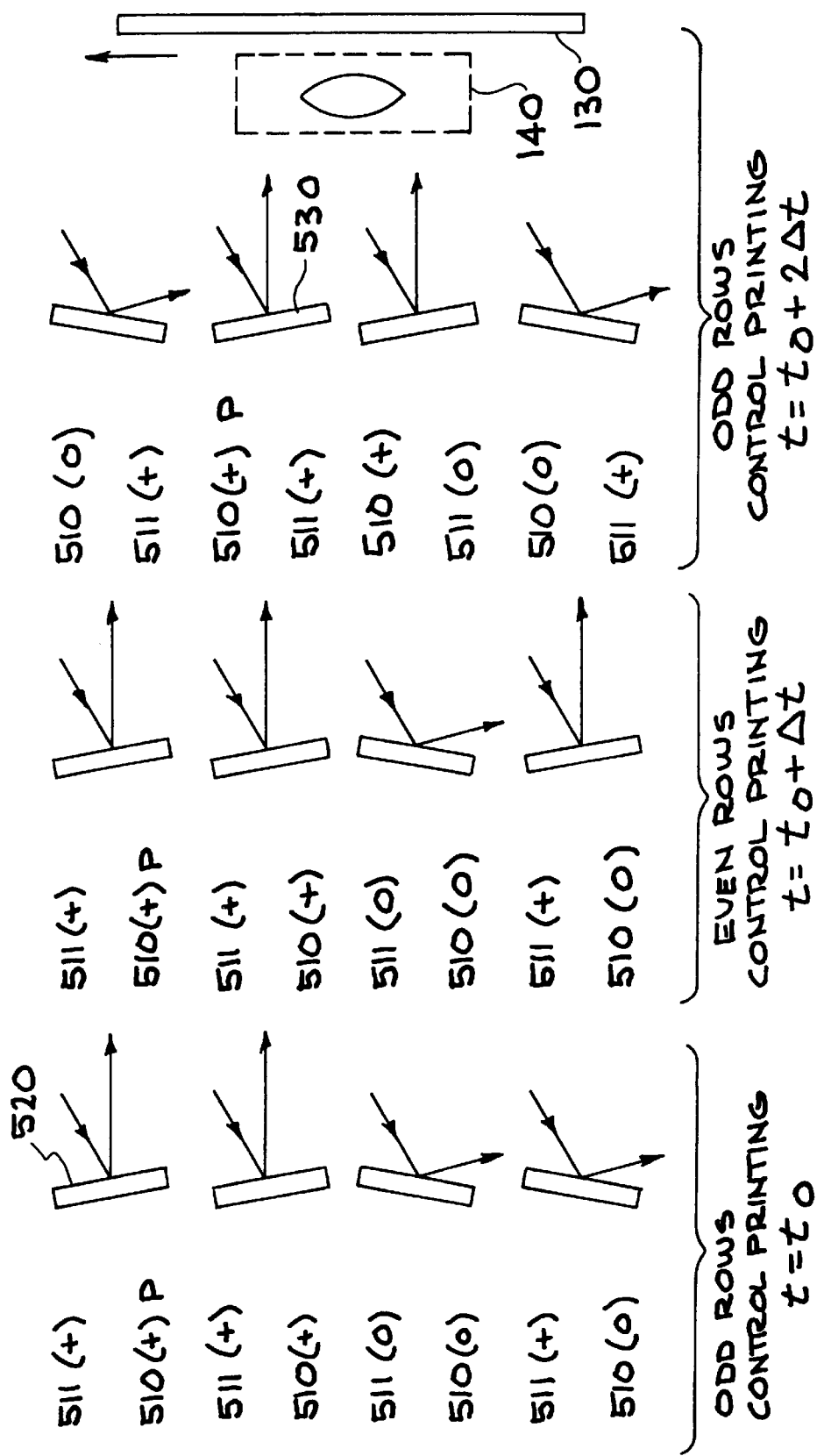
FIG. 5A illustrates micromirror orientation at time $t=t_0$.
FIG. 5B illustrates micromirror orientation at time $t=t_0+\Delta t$.
FIG. 5C illustrates micromirror orientation at time $t=t_0+2\Delta t$.

In a further embodiment, rows of micromirrors can be interleaved vertically in time rather than in space, by loading a new image and pulsing the light source every time the wafer moves one row. FIG. 5 shows one column of mirrors and the image data for that column. Here, odd and even rows of the image are multiplexed together in time. At time $t=t_0$, FIG. 5A, the odd rows in the image will be printed by data residing in data registers 510. These data control the orientation of micromirrors (causing them to be tilted either into a reflecting (+) "on" position 320 or non-reflecting (o) "off" position 310). During this step, data describing printing in the even rows is stored in "hidden" registers 511. At time $t=t_0+\Delta t$, FIG. 5B, the data controlling the orientation of micromirrors has moved down one register such that data that was stored in data registers 511 are now in register 510 and control the micromirrors, thus even rows are printed; data that was in stored in data registers 510 are now "hidden" in registers 511. At time $t=t_0+2\Delta t$, FIG. 5C, the data controlling the micromirrors has moved down another position and once again the odd rows are printed. In this way data point P, which is to be converted into one pixel on the wafer, has translated from mirror 520 (FIG. 5A) to mirror 530 (FIG. 5C).

An image generation means has been described using a two-dimensional array of micromirrors, and interleaving in both time and space. For simplicity, one of the axes of the mirror array has been described as parallel to the scan direction in this description. Other orientations are also contemplated; for instance, the array axes could be oriented at 45° to the scan direction. For this example, the size of the micromirrors and the spacing between pixels in the scan direction and perpendicular to it are both smaller by the factor $\sqrt{2}$.

It is contemplated that data handling circuitry such as that used in a charge coupled device (CCD) can be used to move the data that controls the orientation of micromirrors from one register to another. Here a three step voltage field moves data, which exists as an electric charge, down one register at a time. The data (charge) moves down one row per pulse of the light source. Simultaneously, the photoresist coated wafer moves the width of one pixel per pulse of light source 230. Other methods of moving data controlling micromirror movement will be obvious to those skilled in the art. The forgoing description is intended to be illustrative of the present invention and is not to be construed as a limitation or restriction thereon.

Conventional micromirrors used in spatial light modulators are built on 17-micron centers. If these arrays were used to write a 25-mm wide chip with 0.5-micron features, the demagnification of the camera would have to be 34:1. Thus the array (or arrays) in the mask plane would have to be 850 mm long. This would require 1 meter class optics in the camera which would be excessively expensive. The size of the object plane, and therefore the size of the camera optics can be reduced by reducing the micromirror center-to-center spacing or interleaving two arrays as will be described next.

The horizontal and vertical features (the pattern) produced on a photoresist coated semiconductor wafer by the present invention will preferably be composed of a plurality of pixels or small squares each printed on the photoresist coating. For example, a conductor in the circuit can be a row of pixels. In order that features printed on the semiconductor will have straight smooth edges, it is necessary that each pixel be as square as possible. However, diffraction effects can operate to defeat that requirement. If the light intensity at the corners of the image of a reflecting surface of a micromirror is significantly reduced the pixel produced on the photoresist will be rounded and consequently, the pattern produced on the microchip will have a scalloped edge.

Pronounced variations in light intensity at the boundaries, caused by coherence effects, can cause short circuits to be formed in the resulting circuit pattern. It is possible to create an optimum shape for each pixel image in the presence of diffraction by modifying the shape of the micromirror reflecting surface while optimizing the temporal and spatial characteristics of the illumination.

It has been found that the shape of the reflecting surface can be optimized so smooth-sided lines can be printed, where the narrowest lines are either a single row or a single column of pixels. Therefore, a row of pixel images that are incoherent to one-another should add such that the full-width, half-maximum (FWHM) (or some other intensity contour) of the line is of constant width. This FWHM of a line of images can be defined by two straight, parallel lines that are spaced one pixel width apart.

Figure 6:
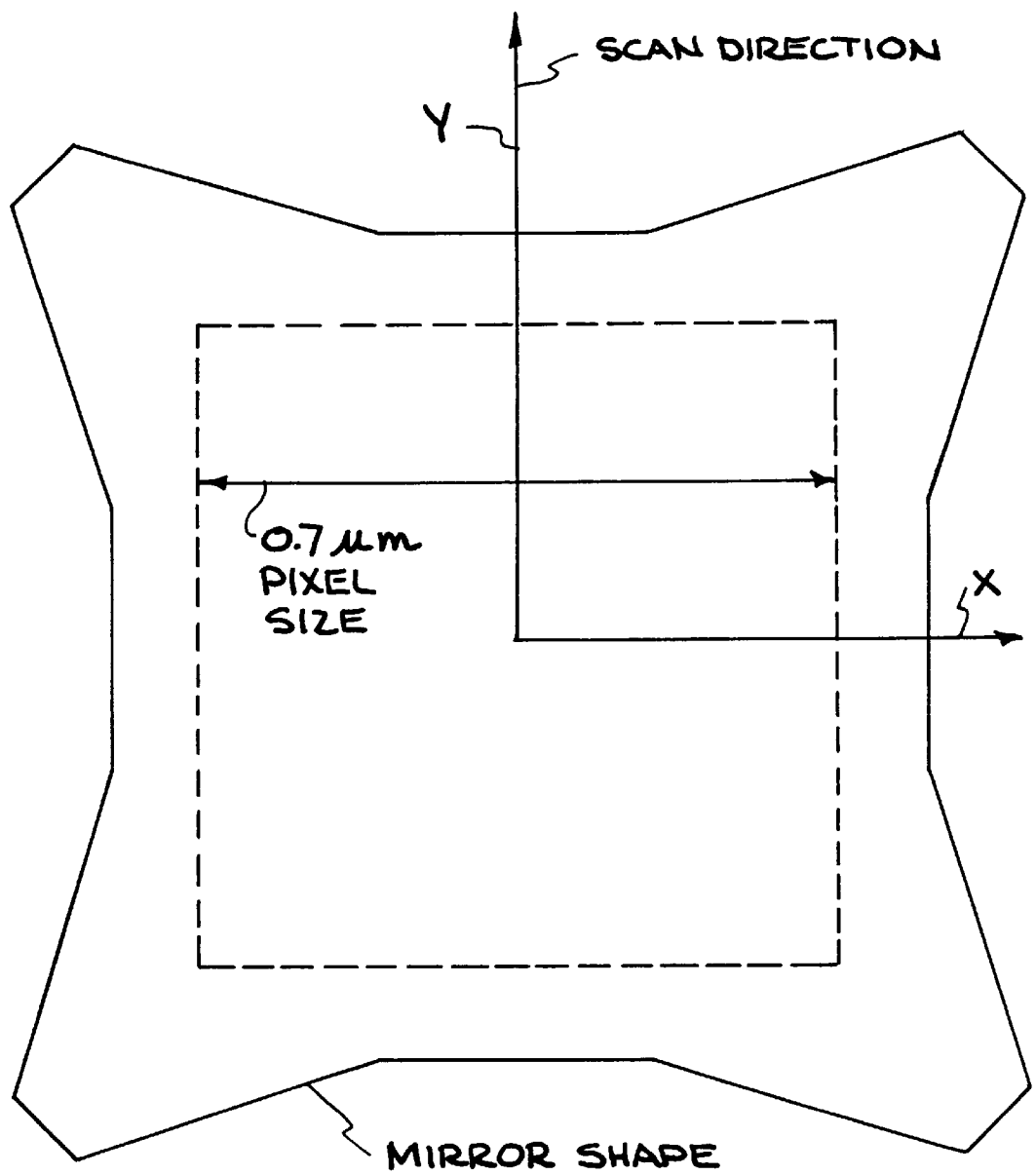
FIG. 6 illustrates an optimized micromirror shape.
Figure 7:
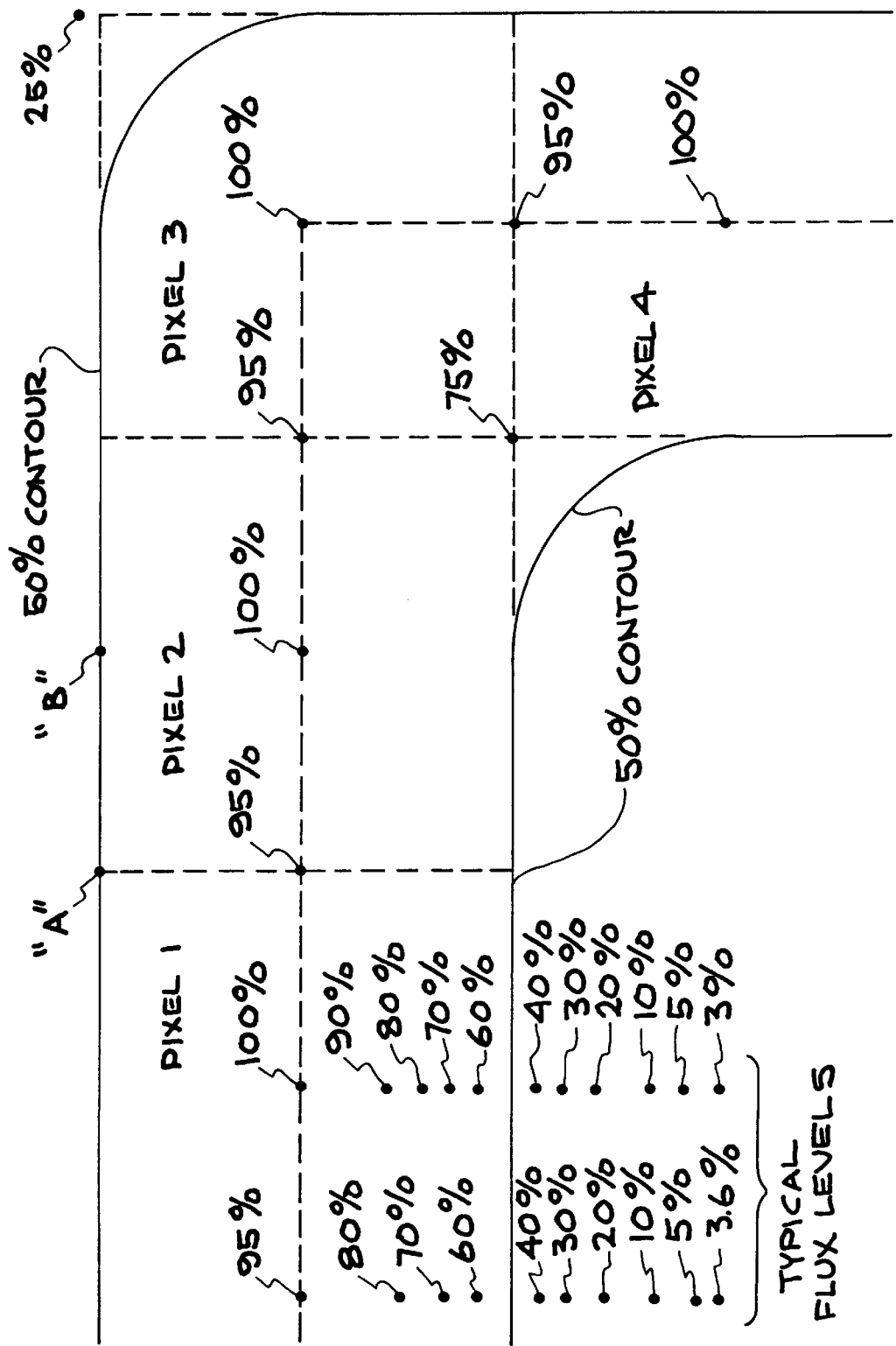
FIG. 7 shows a calculated line shape printed by an optimized micromirror shape.
Figure 8:
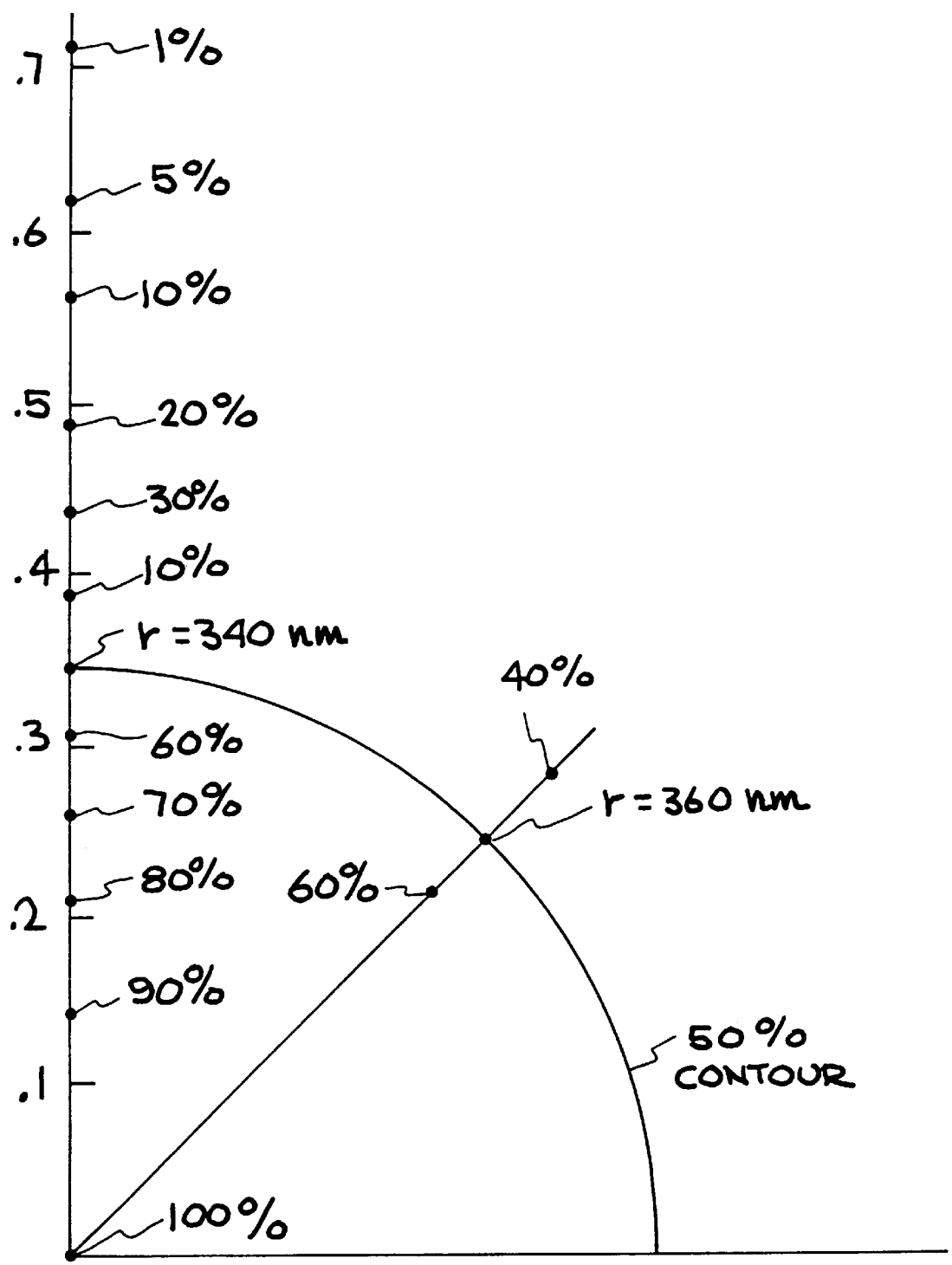
FIG. 8 shows a calculated via hole printed by an optimized micromirror.

If the pixels generated by a row of unoptimized square micromirrors are printed, they will create a narrow, scalloped line if the width of the line is near the Critical Dimension (CD), or printing limit, of the lithography system. If the FWHM of the line to be printed is supposed to be equal to the geometrically calculated pixel width, the square mirrors have to be 5–10% larger than the desired line width. The lines will now be wide enough at the center of each pixel but they will still be scalloped and 10–15% too narrow at the pixel intersections. The shape of the reflecting surface can be sculpted to correct this; for example, various projections or "ears" can be added to the corners of the reflecting surface as shown in FIG. 6. FIG. 6 is a reflecting surface shape that will print 0.25 $\mu$m wide lines using 248 nm light (numerical aperture =0.7 and quadrapole illumination). FIG. 7 is a computed intensity profile for the line that would be printed on a wafer using the mirror geometry of FIG. 6. Referring now to FIG. 7, in the calculations point "A" receives intensity contributions from pixels 1 and 2 and point "B" has intensity contributions from pixels 1, 2 and 3. FIG. 8 is the intensity profile at the wafer plane of one pixel. It could print a via hole on the wafer.

It is well known in the art of lithographic mask design that features such as the projections or "ears" shown in FIG. 6 can be added to a mask, thus changing the intensity profile of the image, which improves the shape of the printed features on the wafer. For example, a mask might be altered so it prints more-or-less square via holes. The same well-known design technique an be used to optimize the shapes of the reflecting surfaces of the micromirrors of the present invention; except the design criteria are different and unique. Here the micromirrors are designed such that when a row of pixels generated by these optimized micromirrors are printed, each one being incoherent with respect to its neighbors, the resulting image will have straight sides (at some intensity contour).

There are other ancillary features, well known in the art, that can be added to a mask to optimize the printed image. Examples include phase-reversed features (commonly known as phase masks) and small and/or attenuated ancillary features whose images are not intense enough to print, but contribute coherently to the desired image. Squaring of the image of the micromirror into the entrance pupil of camera 140 can be further improved with the use of "quadrapole" or annular shapes and off-axis illumination as will be obvious to those skilled in the art . The description of reflecting features that can be added to the reflecting surfaces of the micromirrors to reduce diffraction effects and alternative illumination means is intended to be illustrative of the present invention and is not to be construed as a limitation or restriction thereon.

The inventors have discovered that interleaving the micromirrors in both space and time permits smaller optics, printing of smaller features on the wafer, and improved line width control. The inventors have further discovered that by reducing the size of the reflecting surfaces on each substrate such that the reflecting surfaces are no longer juxtaposed, coherence effects which cause the light intensity at the boundaries between pixels to be unpredictable (typically ranging from zero to one) can be substantially eliminated, thereby improving the quality of the image printed on the photoresist coated semiconductor wafer. In a preferred geometry, the reflecting surface on each tiltable substrate can be roughly half the size of the micromirror center-to-center spacing (as measured in the scan direction). This separation between the pixels that are being printed at any one instant in time makes their images nearly incoherent with respect to one-another. Furthermore, the adjacent pixels that are printed at different times will also be incoherent with those mentioned above. Hence the printed image will be the incoherent sum of all the pixels printed and thus, smooth-sided lines can be printed.

In the present invention reflecting surfaces smaller than the micromirror substrates can be made by several processes known to those skilled in the art. For example, a non-reflective coating can be deposited onto the reflecting surface of the conventional micromirror and then a mask designed to limit the size of the reflecting area can be deposited on the reflecting surface of the micromirror. A new micromirror having the proper dimension and shape, such as 220 (FIG. 2) or FIG. 6, can be formed by etching away part of the non-reflective coating. These smaller size micromirrors can then be interleaved both in space and time as set forth hereinabove.

The demand for smaller critical dimensions in advanced computer chips is continuing to spur improvements in projection lithography. Presently, deep ultraviolet lithography systems, operating at 248 nm and producing 0.25 gm features, are commercially available and 193 nm lithography systems, capable of producing features in the 0.18 gm range, are under development. In order to produce smaller features it is necessary to operate at even shorter wavelengths. By utilizing extreme ultraviolet (EUV) radiation in the range of 4.5–15 nm it is possible to produce features smaller than 0.18 gm. The resolution and therefore, the minimum feature size that can be obtained with EUV is a factor of 2–6 times better than with the present deep-UV or 193 nm lithography. The present invention contemplates the use of EUV radiation as a light source. However, the use of EUV radiation to produce patterns smaller than 0.18 $\mu$m on microchips poses unique problems.

Moreover, EUV radiation is absorbed by ordinary mirror surfaces such as glass or silicon. Therefore, in applications wherein EUVL radiation is used special mirror surfaces must be provided. In one embodiment of the present invention all the reflective micromirror surfaces needed to reflect EUV radiation are coated with precisely matched multilayer Bragg reflective coatings comprising periodic alternating layers of molybdenum and silicon or molybdenum and beryllium having bilayer periods equal to approximately half of the reflected wavelength at normal incidence. Moreover, these multilayer coatings can be deposited on the micromirror elements with graded multilayer periods to maintain the wavelength of peak reflectance as the angle of incidence changes across the figure of each micromirror element. Further, the shape of the reflecting parts of the micromirror can be defined by depositing a non-reflective masking material onto the portions of the substrate that should not reflect.

SEQUENCE LISTING

Not Applicable.

We claim:

1. A method for maskless projection lithography, the method comprising the steps of:

a) providing a two-dimensional array of individually addressable micromirrors, each micromirror comprising a plurality of moveable substrates having a reflecting surface, said reflecting surface for reflecting light from a light source into an imaging means entrance pupil, said reflecting surfaces modified by coating said surfaces with a non-reflecting coating and etching away only a portion of said non-reflective coating, thereby providing said reflecting surfaces with features for minimizing coherence and diffraction effects in said reflected light, said features comprising:
  i) a reflecting surface having a shape consisting essentially of an octagon having regular trapezoidal projections laying at every other side of said octagon and wherein the wider base of each of said trapezoidal projections is contiguous with said octagon,
  ii) a reflecting surface having a dimension measured in a scan direction which is at least one-half of a center-to-center distance between adjacent micromirrors; and
  iii) a reflecting surface have an edge which includes a plurality of phase reversed features and small light attenuating features along said edge;
b) illuminating said array with said source of light, said light reflected by each of said micromirrors comprising a pixel having a light distribution profile, said reflected light imaged by said imaging means in a distant focal plane, said imaged light comprising rows or columns of pixels arranged so that adjacent pixels adds constructively to provide smooth and continuous straight regions of light and dark lines, said lines having a minimum width comprising a single row or a single column of said pixels;
c) controllably moving said micromirrors so as to orient each such that said light reflected by said reflecting surfaces is directed either into or away from said imaging means entrance pupil; and
d) sequencing the movement of said micromirrors so as to cause each of said micromirrors to move in proper sequence so as to scan a predetermined coordinate pattern across said array of micromirrors, in said scan direction, thereby causing an image of said pattern to be reproduced in said focal plane, said sequencing means including temporally interleaving rows of said micromirrors where said rows are parallel to said scan direction.

2. The method of claim 1, wherein said light source comprise a pulsed light source.

3. The method of claim 2, wherein said pulsed light source is a pulsed laser.

4. The method of claim 3, wherein said light source includes a discharge source.

5. The method of claim 4, wherein said discharge source is configured to produce a light pulse.

6. The method of claim 4, wherein said discharge source is a pulsed plasma.

7. The method of claim 1, wherein said reflected light is imaged into said imaging means entrance pupil as an annular or quadrapole shape or as off-axis illumination.

8. The method of claim 1, wherein the two-dimensional array of micromirrors is produced by optically interleaving at least two separate two-dimensional arrays of micromirrors.

9. The method of claim 1, wherein the two dimensional array of micromirrors comprise at least two sets of micromirrors, wherein the two sets are separate and offset from one another and temporally interleaved.

10. The method of claim 1, wherein the size of the reflecting surface is configured such that coherence effects between nearby pixels are minimized.

11. The method of claim 1, wherein the reflecting surfaces of the micromirrors are coated with precisely matched multilayer Bragg reflection coatings.

12. The method of claim 11, wherein the multilayer Bragg coating is Mo/Si or Mo/Be having bilayer periods equal to about one-half of said reflected wavelength at normal incidence.

13. The method of claim 11, wherein the multilayer coating is deposited with graded multilayer periods to maintain the wavelength of peak reflectance as the angle of incidence changes across each of said micromirrors.

* * * * *